(12) United States Patent
Xu et al.

(10) Patent No.: US 10,223,968 B2
(45) Date of Patent: Mar. 5, 2019

(54) ORGANIC LIGHT-EMITTING OLED DATA COMPENSATION CIRCUITS AND METHODS AND THE OLED DISPLAY DEVICES THEREOF

(71) Applicant: Shenzhen China Star Optoelectronics Technology Co., Ltd., Shenzhen, Guangdong (CN)

(72) Inventors: Jing Xu, Guangdong (CN); Tai-jiun Hwang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 341 days.

(21) Appl. No.: 15/038,467

(22) PCT Filed: Mar. 21, 2016

(86) PCT No.: PCT/CN2016/076846
§ 371 (c)(1),
(2) Date: May 22, 2016

(87) PCT Pub. No.: WO2017/143637
PCT Pub. Date: Aug. 31, 2017

(65) Prior Publication Data
US 2018/0204514 A1    Jul. 19, 2018

(30) Foreign Application Priority Data
Feb. 25, 2016   (CN) .......................... 2016 1 0105554

(51) Int. Cl.
*G09G 3/3258* (2016.01)
*H01L 27/32* (2006.01)

(52) U.S. Cl.
CPC ....... *G09G 3/3258* (2013.01); *H01L 27/3262* (2013.01); *G09G 2310/0264* (2013.01); *G09G 2320/0204* (2013.01)

(58) Field of Classification Search
CPC ... G09G 2320/0295; G09G 2300/0861; G09G 3/3233; G09G 3/3291
See application file for complete search history.

(56) References Cited

U.S. PATENT DOCUMENTS 9,159,266 B2 * 10/2015 Kim .................... G09G 3/3233
2011/0084955 A1   4/2011 Kim
(Continued)

*Primary Examiner* — Abbas I Abdulselam
(74) *Attorney, Agent, or Firm* — Andrew C. Cheng

(57) ABSTRACT

An OLED data compensation circuit and method, and an OLED display device are disclosed. The OLED data compensation circuit includes: a sensing circuit for detecting a drifting amount of a threshold voltage of thin film transistors (TFTs); a timing controller connected with the sensing circuit for receiving the drifting amount, and outputting voltage control signals and source driving signals, which controlling a voltage of data signals outputted by a source driver; a reference voltage output circuit connected with the timing controller, is configured for outputting a first reference voltage in accordance with the voltage control signals, the voltage of the data signals and the first reference voltage are configured for compensating the drifting amount of the threshold voltage of the driving TFTs to compensate data of the OLED. In this way, the OLED data compensation is not limited only by the source driver, the OLED data compensation may be enhanced.

17 Claims, 3 Drawing Sheets

(56) References Cited

U.S. PATENT DOCUMENTS

| | | | |
|---|---|---|---|
| 2011/0134093 A1* | 6/2011 | Chen | G09G 3/3685 345/211 |
| 2013/0093652 A1 | 4/2013 | Kim et al. | |
| 2013/0127692 A1 | 5/2013 | Yoon et al. | |
| 2013/0162617 A1* | 6/2013 | Yoon | G09G 3/3291 345/211 |
| 2014/0168194 A1 | 6/2014 | Kong et al. | |
| 2015/0001504 A1 | 1/2015 | Kim et al. | |
| 2015/0061533 A1 | 3/2015 | Miyake et al. | |
| 2015/0145845 A1 | 5/2015 | Nam et al. | |
| 2015/0170571 A1 | 6/2015 | Park et al. | |
| 2015/0179107 A1 | 6/2015 | Kim | |
| 2015/0187274 A1 | 7/2015 | Kim | |
| 2015/0187278 A1 | 7/2015 | Park | |
| 2016/0055791 A1 | 2/2016 | Kishi et al. | |
| 2017/0098407 A1* | 4/2017 | Jeong | G09G 3/2051 |

\* cited by examiner

ORGANIC LIGHT-EMITTING OLED DATA COMPENSATION CIRCUITS AND METHODS AND THE OLED DISPLAY DEVICES THEREOF

BACKGROUND OF THE INVENTION

1. Field of the Invention

The present disclosure relates to organic light-emitting diode (OLED) display technology, and more particularly to an OLED data compensation circuit and method, and an OLED display device.

2. Discussion of the Related Art

Conventionally, the data driver senses a threshold voltage of the thin film transistors (TFTs) driven by each of the pixels, and compensates the data of each of the pixels in accordance with the sensed threshold voltage.

However, when the calculated compensation voltage exceeds the maximum voltage of the data driver, it is difficult to correctly compensate the data.

SUMMARY

DETAILED DESCRIPTION OF THE EMBODIMENTS

Embodiments of the invention will now be described more fully hereinafter with reference to the accompanying drawings, in which embodiments of the invention are shown.

Figure 1:
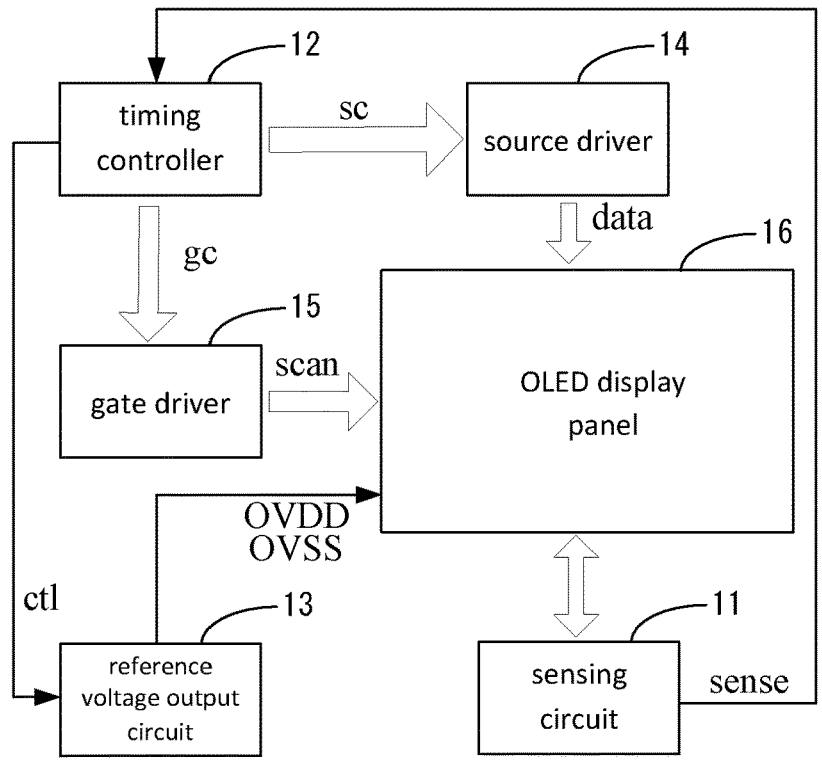
FIG. 1 is a schematic view of the OLED data compensation circuit in accordance with one embodiment.

FIG. 1 is a schematic view of the OLED data compensation circuit in accordance with one embodiment. As shown in FIG. 1, the OLED data compensation circuit includes a sensing circuit 11, a timing controller 12, and a reference voltage output circuit 13, The sensing circuit 11 is configured for detecting a drifting amount (sense) of a threshold voltage of thin film transistor (TFTs), wherein the TFTs are configured for driving the OLED. A display panel 16 includes a plurality of OLEDs arranged in a matrix. The timing controller 12 connects with the sensing circuit 11 for receiving the drifting amount (sense), and is configured for outputting voltage control signals (ctl) and source driving signals (sc). The source driving signals (sc) are configured for controlling a voltage of data signals (data) outputted by a source driver 14. The reference voltage output circuit 13 connects with the timing controller 12, and is configured for outputting a first reference voltage (OVSS) in accordance with the voltage control signals (ctl). The voltage of the data signals (data) outputted by the source driver 14 and the first reference voltage (OVSS) controls the drifting amount of the threshold voltage of the driving TFTs so as to compensate the data of the OLED.

In the embodiment, the reference voltage output circuit 13 further outputs a second reference voltage (OVDD) transmitting to a drain of the TFT. The timing controller 12 further outputs gate driving signals (gc) controlling a gate driver 15 to output scanning signals (scan). In this way, the data signals (data) are transmitted to the driving TFTs.

In one embodiment, the timing controller 12 is configured for calculating a compensation voltage in accordance with the drifting amount (sense), outputting the voltage control signals (ctl) and the source driving signals (sc) in accordance with the compensation voltage, and determining if the compensation voltage is not within a voltage range of the data signals outputted by the source driver 14. If the compensation voltage is within a voltage range of the data signals outputted by the source driver 14, the source driving signals (sc) are adjusted to control the voltage of the data signals outputted by the source driver 14. If the compensation voltage is not within a voltage range of the data signals outputted by the source driver 14, the voltage control signals (ctl) are adjusted such that the reference voltage output circuit 13 is controlled to adjust the outputted first reference voltage (OVSS).

The operations of the OLED data compensation circuit of FIG. 1 are described as below.

The sensing circuit 11 is configured for detecting the drifting amount of the threshold voltage (Vth) of the driving TFTs, and for transmitting the feedback to the timing controller 12. The reference voltage output circuit 13 is configured for generating the first reference voltage (OVSS) and the second reference voltage (OVDD) for the OLED, and for adjusting the outputted first reference voltage (OVSS) in accordance with the voltage control signals (ctl). The timing controller 12 is configured for generating the source driving signals (sc) and the gate driving signals (gc) generated by image data and algorithms. The gate driver 15 is configured for receiving the gate driving signals (gc) from the timing controller 12 and for outputting the scanning signals (scan) to turn on the scanning lines. The source driver 14 receives the image data from the timing controller 12, and outputs the data signals (data) to cooperatively operate with the scanning lines so as to charge the data line. That is, the data signals (data) are transmitted to the driving TFTs. The timing controller 12 is also configured for receiving the drifting amount (sense) of the threshold voltage (Vth) of the driving TFTs detected by the sensing circuit 11, and for outputting the voltage control signals (ctl) in accordance with the drifting amount (sense) of the threshold voltage (Vth). In this way, the reference voltage output circuit 13 is controlled to compensate the drifting amount (sense) of the threshold voltage (Vth) of the driving TFTs.

If the voltage of the data signals (data) outputted from the source driver 14 is within a maximum voltage range of the source driver 14, the voltage of the data signals (data) outputted from the source driver 14 may be adjusted to compensate the drifting amount of the threshold voltage (Vth) of the driving TFTs. If the voltage of the data signals (data) outputted from the source driver 14 is not within a maximum voltage range of the source driver 14, the timing controller 12 outputs the voltage control signals (ctl) in accordance with the drifting amount (sense) of the threshold voltage (Vth) of the driving TFTs. The reference voltage output circuit 13 adjusts the outputted first reference voltage (OVSS) in accordance with the voltage control signals (ctl) so as to compensate the drifting amount (sense) of the threshold voltage (Vth) of the driving TFTs.

The compensation process will be described hereinafter.

Figure 2:
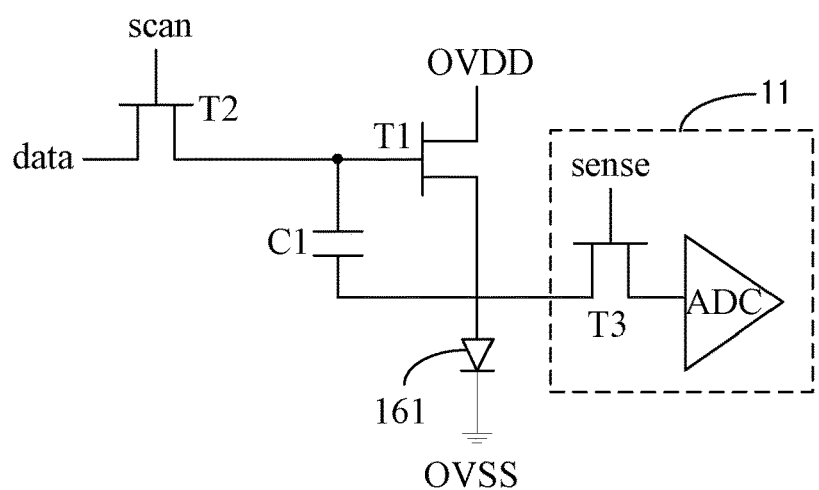
FIG. 2 is a schematic view showing the operations of the OLED data compensation circuit in accordance with one embodiment.

FIG. 2 is a schematic view showing the operations of the OLED data compensation circuit in accordance with one embodiment. The first TFT (T1) is the above driving TFT. The source (S) of the first TFT (T1) connects with a first end of the OLED (161), and a second end of the OLED (161) connects to the first reference voltage (OVSS).

A drain (D) of the first TFT (T1) connects with the second reference voltage (OVDD). The gate (G) of the first TFT (T1) connects to the source of the second transistor (T2), the gate of the second transistor (T2) connects to the scanning signals (scan), the source of the second transistor (T2) receives the data signals (data), the gate (G) of the first TFT (T1) connects to the source of the third transistor (T3), and the drain of the third transistor (T3) connects to an analog-to-digital converter (ADC). The gate of the third transistor (T3) detects the drifting amount (sense) of the threshold voltage (Vth) of the first TFT (T1), wherein the third transistor (T3) and the ADC constitute the sensing circuit 11.

The operations of the OLED (161) will be described hereinafter:

The equation regarding the current (Ioled) of the OLED (161) is shown as below:

$$Ioled = k(Voled - Vth\_oled)^\alpha;$$

Wherein k and α are constant numbers, Voled represents a voltage difference between two ends of the OLED (161), and Vth_oled represents the threshold voltage of the OLED.

When the first reference voltage (OVSS) decreases, the voltage difference between two ends of the OLED (161) increases, and thus the current of the OLED (161) increases.

As the current is cooperatively determined by the OLED (161) and the first TFT (T1), the equation regarding the current (Ids) of the first TFT (T1) is shown as below:

$$Ids = K(Vgs - Vth)^2 = K(Vg - Vs - Vth)^2;$$

Wherein Vgs represents the voltage difference between the gate and the source of the first TFT (T1), Vth represents the threshold voltage of the first TFT (T1), Vg represents the voltage of the gate of the first TFT (T1), and Vs represents the voltage of the source of the first TFT (T1).

When Vg remains the same and the current is increased, the Vs may be pulled down. Thus, by pulling down the Vs, the difference between Vgs and Vth (Vgs−Vth) remains the same.

For instance, when the threshold voltage (Vth) of the first TFT (T1) drifts for 1 V, and the maximum voltage of the data signals (data) outputted by the source driver is 10 V. in order to compensate the drifting amount of the threshold voltage (Vth), the voltage of the data signals (data) outputted by the source driver has to be raised up for 1V on the original basis. When the voltage of the outputted data signals is 10V, in order to compensate the drifting amount of the threshold voltage (Vth), the corresponding compensation voltage should be 11 V. However, 11V is not within the voltage range of the data signals (data) outputted by the source driver. At this moment, the voltage of the data signals (data) outputted from the source driver may not effectively compensate the drifting amount of the threshold voltage (Vth) of the first TFT (T1). Thus, the first reference voltage (OVSS) is pulled down for 1 V such that the voltage of the driving TFT (Vs) is pulled down for 1V. In this way, the difference between Vgs and Vth (Vgs−Vth) remains the same.

In the embodiment, when the voltage of the data signals (data) outputted from the source driver 14 is not within a maximum voltage range of the source driver 14, the timing controller 12 outputs the voltage control signals (ctl) in accordance with the drifting amount (sense) of the threshold voltage (Vth) of the driving TFTs. The reference voltage output circuit 13 outputs the first reference voltage (OVSS) in accordance with the voltage control signals (ctl) so as to compensate the drifting amount (sense) of the threshold voltage (Vth) of the driving TFTs. In this way, the OLED data compensation is not limited only by the source driver, and the OLED data compensation may be enhanced.

In one embodiment, an OLED display device includes an OLED display panel, a source driver, and the above OLED data compensation circuit. The OLED display panel includes a plurality of OLEDs arranged in a matrix. The source driver is configured for outputting the data signals and for transmitting the data signals to the driving TFTs. The OLED data compensation circuit is configured for compensating the drifting amount of the threshold voltage (Vth) of the driving TFTs. The OLED display device also includes a gate driver turning on the scanning lines of the OLED display panel such that the source driver may charge the data lines of the OLED display panel via the outputted data signals. The structure of the OLED display panel is shown in FIG. 1 and thus is omitted hereinafter.

Figure 3:
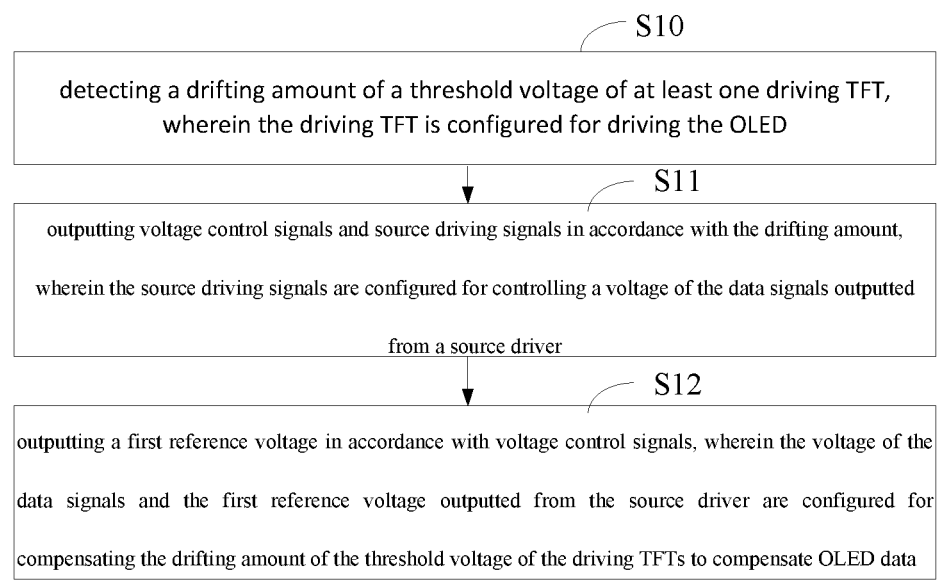
FIG. 3 is a flowchart illustrating the OLED data compensation method in accordance with a first embodiment.

FIG. 3 is a flowchart illustrating the OLED data compensation method in accordance with a first embodiment. The method includes:

In step S10: detecting a drifting amount of a threshold voltage of at least one driving TFT, wherein the driving TFT is configured for driving the OLED. A first end of the OLED connects to the source of the driving TFT, and a second end of the OLED connects to a reference voltage. The voltage difference between two ends of the OLED relates to the voltage at the first end minus the voltage at the second end. The data of the OLED may be compensated by increasing the voltage applied to the first end or by decreasing the voltage applied to the second end.

In step S11, outputting voltage control signals and source driving signals in accordance with the drifting amount, wherein the source driving signals are configured for controlling a voltage of the data signals outputted from the source driver.

In step S11, the gate driving signals are also outputted. The gate driving signals are configured for controlling the gate driver to output the scanning signals so as to transmit the data signals to the driving TFT. Specifically, the scanning lines of the OLED display panel may be turned on in accordance with the scanning signals. Cooperatively operating with the source driver, the source driver transmits the data signals to the gate of the driving TFT. The voltage difference between the gate and the source of the driving TFT may be larger when the voltage of the data signals is larger, which may compensate the drifting amount of the threshold voltage of the driving TFT. That is, increasing the voltage of the first end of the OLED. When the first reference voltage remains the same, the data of the OLED may be compensated by configuring the voltage difference between two ends of the OLED to be larger.

In step S12, outputting the first reference voltage in accordance with voltage control signals, wherein the voltage of the data signals and the first reference voltage outputted from the source driver are configured for compensating the drifting amount of the threshold voltage of the driving TFTs.

When the voltage of the data signals outputted from the source driver is not within the maximum voltage range outputted by the source driver, the OLED data compensation cannot be conducted by adjusting the voltage of the data signals outputted by the source driver. At this moment, the OLED data compensation can be conducted by decreasing the voltage at the second end of the OLED. That is, decreasing the first reference voltage.

In step S12, outputting a second reference voltage to a drain of the driving TFT.

In the embodiment, the compensation voltage is calculated in accordance with the drifting amount. The voltage control signals and the source driving signals are outputted in accordance with the compensation voltage. Specifically, a determination is made regarding whether the compensation voltage has exceeded the voltage range of the data signals outputted by the source driver. If not, the source driving signals are adjusted to control the voltage of the data signals outputted by the source driver. That is, the voltage of the first end of the OLED is increased to compensate the OLED data. If the compensation voltage has exceeded the voltage range of the data signals outputted by the source driver, the voltage control signals are adjusted to control the first reference voltage outputted by the voltage output circuit. That is, the OLED data is compensated by decreasing the voltage of the second end of the OLED. In this way, the OLED data compensation is not limited only by the source driver, and the OLED data compensation may be enhanced.

Figure 4:
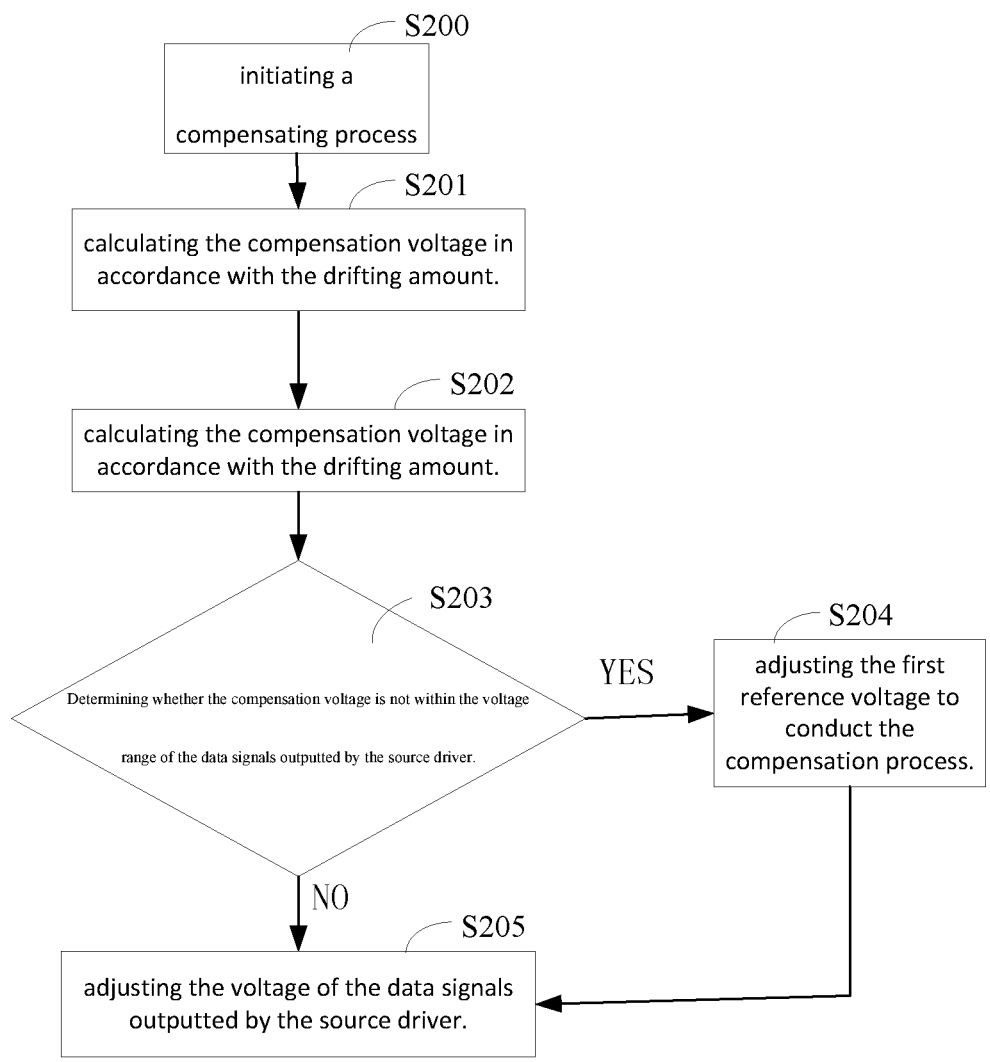
FIG. 4 is a flowchart illustrating the OLED data compensation method in accordance with a second embodiment.

FIG. 4 is a flowchart illustrating the OLED data compensation method in accordance with a second embodiment. The method includes:

In step S200: initiating a compensating process.

In step S201: detecting a drifting amount of a threshold voltage of at least one driving TFT. A first end of the OLED connects to the source of the driving TFT, and a second end of the OLED connects to a second reference voltage. The voltage difference between two ends of the OLED relates to the voltage at the first end minus the voltage at the second end. The data of the OLED may be compensated by increasing the voltage applied to the first end or by decreasing the voltage applied to the second end.

In step S202, calculating the compensation voltage in accordance with the drifting amount.

In step S203, determining whether the compensation voltage is not within the voltage range of the data signals outputted by the source driver. If the compensation voltage is not within the voltage range, the process goes to step S204. If the compensation voltage is within the voltage range, the process goes to step S205.

In step S204, adjusting the first reference voltage to conduct the compensation process.

Specifically, the first reference voltage is adjusted in accordance with the drifting amount. That is, the voltage at the second end of the OLED is decreased to compensate the OLED data.

In step S205, adjusting the voltage of the data signals outputted by the source driver.

Specifically, the source driver increases the voltage of the outputted data signals. When the scanning line is turned on, the data signals are transmitted to the gate of the driving TFT, which increases the voltage of the driving TFT. When the first reference voltage remains the same, the drifting amount of the threshold voltage of the driving TFT may be compensated, and so does the OLED data. In this way, the OLED data compensation is not limited only by the source driver, and the OLED data compensation may be enhanced.

In view of the above, the sensing circuit detects the drifting amount of the threshold voltage of the driving TFT, wherein the driving TFT is configured for driving the OLED. The timing controller receives the drifting amount, and outputs the voltage control signals and the source driving signals in accordance with the drifting amount. The source driving signals controls the voltage of the data signals outputted by the source driver. The reference voltage output circuit outputs the first reference voltage in accordance with the voltage control signals, wherein the voltage of the data signals outputted by the source driver and the first reference voltage are configured for compensating the drifting amount of the threshold voltage of the driving TFT so as to compensate the OLED data. In this way, the OLED data compensation is not limited only by the source driver, and the OLED data compensation may be enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An organic light-emitting diode (OLED) data compensation circuit, comprising: a sensing circuit configured for detecting a drifting amount of a threshold voltage of thin film transistors (TFTs), wherein the TFTs are configured for driving the OLED; a timing controller connected with the sensing circuit for receiving the drifting amount, and configured for outputting voltage control signals and source driving signals, wherein the source driving signals are configured for controlling a voltage of data signals outputted by a source driver; a reference voltage output circuit connected with the timing controller, wherein the reference voltage output circuit is configured for outputting a first reference voltage in accordance with the voltage control signals, a first end of the OLED is directly connected with a source of the TFTs, a second end of the OLED is directly connected with the first reference voltage, and the voltage of the data signals outputted by the source driver and the first reference voltage are configured for compensating the drifting amount of the threshold voltage of the driving TFTs to compensate data of the OLED.

2. The OLED data compensation circuit as claimed in claim 1, wherein the timing controller further outputs the gate driving signals controlling a gate driver to output scanning signals such that the data signals are transmitted to the driving TFTs.

3. The OLED data compensation circuit as claimed in claim 1, wherein the reference voltage output circuit is configured for outputting a second reference voltage to be transmitted to a drain of the driving TFTs.

4. The OLED data compensation circuit as claimed in claim 1, wherein the timing controller is configured for:
calculating the compensation voltage in accordance with the drifting amount; and
outputting the voltage control signals and the source driving signals in accordance with the compensation voltage.

5. The OLED data compensation circuit as claimed in claim 4, wherein the timing controller is configured for:
determining whether the compensation voltage is not within the voltage range of the data signals outputted by the source driver;
when the compensation voltage is within the voltage range, the source driving signals are adjusted to control the voltage of the data signals outputted by the source driver; and when the compensation voltage is not within the voltage range, the voltage control signals are adjusted such that the reference voltage output circuit is controlled to adjust the outputted first reference voltage.

6. The OLED data compensation circuit as claimed in claim 5, wherein
when the compensation voltage is higher than the maximum voltage of the data signals outputted by the source driver, the voltage control signals are adjusted such that the reference voltage output circuit is controlled to decrease the outputted first reference voltage.

7. An OLED data compensation method, comprising: detecting a drifting amount of a threshold voltage of at least one driving TFT, wherein the driving TFT is configured for driving the OLED; outputting voltage control signals and source driving signals in accordance with the drifting amount, wherein the source driving signals are configured for controlling a voltage of the data signals outputted from a source driver; and outputting a first reference voltage in accordance with voltage control signals, wherein a first end of the OLED is directly connected with a source of the TFTs, a second end of the OLED is directly connected with the first reference voltage; and the voltage of the data signals and the first reference voltage outputted from the source driver are configured for compensating the drifting amount of the threshold voltage of the driving TFTs to compensate OLED data.

8. The method as claimed in claim 7, wherein the step of outputting a first reference voltage in accordance with voltage control signals further comprises:
outputting a second reference voltage to be transmitted to a drain of the driving TFT.

9. The method as claimed in claim 7, wherein the step of outputting voltage control signals and source driving signals in accordance with the drifting amount further comprises:
calculating the compensation voltage in accordance with the drifting amount; and
outputting the voltage control signals and the source driving signals in accordance with the compensation voltage.

10. The method as claimed in claim 9, wherein the step of outputting voltage control signals and source driving signals in accordance with the drifting amount further comprises:
determining whether the compensation voltage is not within the voltage range of the data signals outputted by the source driver;
when the compensation voltage is within the voltage range, the source driving signals are adjusted to control the voltage of the data signals outputted by the source driver; and
when the compensation voltage is not within the voltage range, the voltage control signals are adjusted such that the reference voltage output circuit is controlled to adjust the outputted first reference voltage.

11. The method as claimed in claim 10, wherein
when the compensation voltage is higher than the maximum voltage of the data signals outputted by the source driver, the voltage control signals are adjusted such that the reference voltage output circuit is controlled to decrease the outputted first reference voltage.

12. An OLED display device, comprising: an OLED display panel comprising a plurality of OLEDs arranged in a matrix; a source driver configured for outputting data signals and transmitting the data signals to at least one driving TFT; wherein the source driver comprises an OLED data compensation circuit for compensating a drifting amount of a threshold voltage of the driving TFT to compensate OLED data; the OLED data compensation circuit comprises: a sensing circuit configured for detecting the drifting amount of the threshold voltage of TFTs, wherein the TFTs are configured for driving the OLED; a timing controller connected with the sensing circuit for receiving the drifting amount, and configured for outputting voltage control signals and source driving signals, wherein the source driving signals are configured for controlling a voltage of data signals outputted by a source driver; and a reference voltage output circuit connected with the timing controller, wherein the reference voltage output circuit is configured for outputting a first reference voltage in accordance with the voltage control signals, a first end of the OLED is directly connected with a source of the TFTs, a second end of the OLED is directly connected with the first reference voltage, and the voltage of the data signals outputted by the source driver and the first reference voltage are configured for compensating the drifting amount of the threshold voltage of the driving TFTs to compensate data of the OLED.

13. The OLED display device as claimed in claim 12, wherein the timing controller further outputs the gate driving signals controlling a gate driver to output scanning signals such that the data signals are transmitted to the driving TFTs.

14. The OLED display device as claimed in claim 12, wherein the reference voltage output circuit is configured for outputting a second reference voltage to be transmitted to a drain of the driving TFTs.

15. The OLED display device as claimed in claim 12, wherein the timing controller is configured for:
calculating the compensation voltage in accordance with the drifting amount; and
outputting the voltage control signals and the source driving signals in accordance with the compensation voltage.

16. The OLED display device as claimed in claim 15, wherein the timing controller is configured for:
determining whether the compensation voltage is not within the voltage range of the data signals outputted by the source driver;
when the compensation voltage is within the voltage range, the source driving signals are adjusted to control the voltage of the data signals outputted by the source driver; and
when the compensation voltage is not within the voltage range, the voltage control signals are adjusted such that the reference voltage output circuit is controlled to adjust the outputted first reference voltage.

17. The OLED display device as claimed in claim 16, wherein
when the compensation voltage is higher than the maximum voltage of the data signals outputted by the source driver, the voltage control signals are adjusted such that the reference voltage output circuit is controlled to decrease the outputted first reference voltage.

* * * * *